United States Patent [19]

Tsai et al.

[11] Patent Number: 5,874,342

[45] Date of Patent: Feb. 23, 1999

[54] PROCESS FOR FORMING MOS DEVICE IN INTEGRATED CIRCUIT STRUCTURE USING COBALT SILICIDE CONTACTS AS IMPLANTATION MEDIA

[75] Inventors: Jiunn-Yann Tsai, San Jose; Zhihai Wang, Sunnyvale; Yen-Hui Joseph Ku, Cupertino, all of Calif.

[73] Assignee: LSI Logic Corporation, Milpitas, Calif.

[21] Appl. No.: 890,222

[22] Filed: Jul. 9, 1997

[51] Int. Cl.[6] .................................................. H01L 21/336
[52] U.S. Cl. ...................... 438/301; 438/533; 438/558; 438/649; 438/683
[58] Field of Search .................................. 438/301, 305, 438/530, 533, 558, 559, 592, 649, 655, 683

[56] References Cited

U.S. PATENT DOCUMENTS

| 5,356,837 | 10/1994 | Geiss et al. | 438/535 |
| 5,529,958 | 6/1996 | Yaoita | 438/655 |
| 5,567,651 | 10/1996 | Berti et al. | 438/303 |

OTHER PUBLICATIONS

Berti, Antonio C., et al., "A Manufacturable Process for the Formation of Self Aligned Cobalt Silicide in a Sub Micrometer CMOS Technology", *1992 Proceedings of VMIC Conference,* Jun. 9–10, 1992, pp. 267–273.

Lui, R., et al., "Mechanisms for Process–Induced Leakage in Shallow Silicided Junctions", *IEDM 86,* Dec. 1986, pp. 58–61.

Shone, F.C., et al., "Formation of 0.1 $\mu$m $N^{30}/P$ and $P_+/N$ Junctions by Doped Silicide Technology", *IEDM 85,* Dec. 1985, pp. 407–410.

Wang, Q. F., et al., "New $CoSi_2$ Salicide Technology for 0.1 $\mu$m Processes and Below", *1995 Symposium on VLSI Technology Digest of Technical Papers,* Jun. 1995, pp. 17–18.

Yamazaki, Tatsuya, et al., "21 psec Switching 0.1 $\mu$m–CMOS at Room Temperature Using High Performance Co Salicide Process", *IEDM 93,* Dec. 1993, pp. 906–908.

*Primary Examiner*—T. N. Quach
*Attorney, Agent, or Firm*—John P. Taylor

[57] ABSTRACT

A process which is capable of forming shallow source/drain regions in a silicon substrate and a doped gate electrode by implantation of cobalt silicide contacts of uniform thickness previously formed on the substrate followed by diffusion of the dopant into the substrate to form the desired source/drain regions, and into the polysilicon gate electrode to provide the desired conductivity is described. The process comprises: first depositing a layer of cobalt over a polysilicon gate electrode and areas of a silicon substrate where source/drain regions will be formed; then forming at least one capping layer over the cobalt layer; then annealing the structure at a first temperature to form cobalt silicide; then removing the capping layer, as well as the unreacted cobalt and any cobalt reaction products other than cobalt silicide; then annealing the structure again at a higher temperature than the first anneal to form high temperature cobalt silicide; then implanting the cobalt silicide with one or more dopants suitable for forming source/drain regions in the silicon substrate and for increasing the conductivity of the polysilicon gate electrode; and then heating the structure sufficiently to cause the implanted dopant or dopants in the cobalt silicide to diffuse into the substrate to form the desired source/drain regions and into the polysilicon gate electrode to increase the conductivity thereof.

22 Claims, 3 Drawing Sheets

PROCESS FOR FORMING MOS DEVICE IN INTEGRATED CIRCUIT STRUCTURE USING COBALT SILICIDE CONTACTS AS IMPLANTATION MEDIA

BACKGROUND OF THE INVENTION

1. Field of the Invention

This invention relates to the formation of an MOS device of an integrated circuit structures on semiconductor substrates. More particularly, this invention relates to a process for forming an MOS device using cobalt silicide both as a contact and as an implantation media for forming the source/drain regions and the doped gate electrode of the MOS device.

2. Description of the Related Art

In the formation of integrated circuit structure, and particularly in the formation of MOS devices using polysilicon gate electrodes, it has become the practice to provide a metal silicide layer or contact over the polysilicon gate electrode, and over the source/drain regions of the silicon substrate, to facilitate electrically and metallurgically connecting the silicon to metal interconnects. Thus, for example, a titanium metal layer is usually blanket deposited over the polysilicon gate electrode and the source/drain regions of the silicon substrate, as well as over the silicon oxide insulation regions of the substrate, e.g., the field oxide regions. The structure is then heated sufficiently to cause the titanium in contact with the silicon to react, thereby forming titanium silicide, e.g., heated to about 650° C., while the titanium over the silicon oxide does not react. The unreacted titanium is then removed, leaving only titanium silicide over the silicon source/drain regions of the substrate and over the polysilicon gate electrode. The resulting titanium silicide is then further annealed at a higher temperature, e.g., about 700°–800° C., to convert the titanium silicide to a more electrically desirable (lower resistivity) phase.

However, as the sizes of integrated circuit structures have continued to become smaller and smaller, problems have arisen with the continued use of titanium silicide, particularly in the formation of narrow lines, because the less acceptable lower temperature phase of titanium silicide tends to predominate on narrower lines, apparently due to the failure of the lower temperature phase to convert to the low resistivity higher temperature titanium silicide phase when the line width approaches the grain size of the lower temperature phase. It has, however, been found that cobalt silicide (usually $CoSi_2$) is not subject to the same phase problems when used in forming narrow lines.

While the substitution of cobalt silicide for titanium silicide thus solves some of the problems encountered with the use of titanium silicide with very narrow lines, other problems have, in turn, been encountered with this substitution. For example, when forming very shallow source/drain regions in a single crystal semiconductor substrate such as a silicon substrate by implantation, it is difficult to provide the desired control of the depth of the implantation directly into the substrate, thereby resulting in deeper junctions (causing more junction leakage), as well as possible channeling of the implanted dopant into the substrate. However, by forming the titanium silicide layer over the silicon substrate first, i.e., prior to the implantation step, the implantation depth may be controlled to implant the dopant into the titanium silicide layer instead of the underlying substrate. That is, the titanium silicide layer may be conveniently used as a media for the implantation of one or more dopants therein, due to its thicknesses relative to the thickness of the desired source/drain regions to be formed in the substrate. After the implantation step, diffusion of the dopant (s) from the implanted titanium silicide into the silicon substrate may be carried out during a subsequent anneal, resulting in the desired shallow source/drain regions.

However, when cobalt silicide is substituted for titanium silicide, for the reasons discussed above with respect to smaller line widths, problems are encountered with the concurrent use of the cobalt silicide as a media for implantation because the cobalt silicide has been found to form unevenly in thickness, particularly over raised portions of the underlying integrated circuit structure (such as the polysilicon gate electrode) where the edges of the cobalt silicide tend to thin. This is illustrated in the prior art structure of FIG. 1 wherein cobalt silicide contacts 14 and 16 are shown respectively formed over source/drain regions 4 and 6 in the region of silicon substrate 2 bounded by field oxide 8, and cobalt silicide gate contact 18 has been formed over a polysilicon gate electrode 12 and gate oxide 10 between source/drain regions 4 and 6. Oxide spacers 13 are shown conventionally formed on the sidewalls of gate electrode 12. FIG. 1 shows the thinning of cobalt silicide 18 layer at 19, adjacent the edges of the raised portion of gate electrode 12.

While Liu et al., in an article entitled "Mechanisms for Process-induced Leakage in Shallow Silicided Junctions", *IEDM* 86, pp 58–61, discusses that a semiconductor substrate may be implanted with dopant either before or after forming cobalt silicide thereon, there appears to be no recognition of any problems encountered with the use of cobalt silicide rather than titanium silicide during the implantation. That is, the above-described problem of thinning of the cobalt silicide at the edges of a raised gate electrode is not discussed by Liu et al. (perhaps because they were using a much thicker silicide which can be tolerated for less advanced process technologies).

The formation of cobalt silicide using a capping layer of titanium or titanium nitride formed over the cobalt layer has also been proposed to improve certain properties of the cobalt silicide subsequently formed over the substrate. For example, Berti et al., in an article entitled "A Manufacturable Process for the Formation of Self Aligned Cobalt Silicide in a Sub Micrometer CMOS Technology", published on pages 267–273 of the VMIC Conference held in Santa Clara, Calif. in 1992, state that processing temperature, resistivity, contact resistance, junction leakage, and stress are all lower when using cobalt silicide instead of titanium silicide. However, they report that the difficulty in implementing cobalt silicide in a manufacturing environment has been due to the inability to repeatedly avoid unwanted cobalt silicide overgrowth on the oxide spacers (which can result in electrical shorting) while simultaneously forming thick and uniform cobalt silicide. They reported that the problem of cobalt silicide overgrowth on the oxide portions of the integrated circuit structure could be eliminated by the reactive sputtering of a capping layer of titanium nitride over the layer of cobalt prior to the annealing step to form cobalt silicide.

A later article by Yamazaki et al., entitled "21 psec switching 0.1 $\mu$m-CMOS at room temperature using high performance Co salicide process", published on pages 906–908 of *IDEM* 93, reports that in conventional cobalt salicide (self-aligned silicide), the gate sheet resistance increased below a 1.0 $\mu$m gate length because the cobalt layer was oxidized during the first silicidation annealing. They reported that the use of a titanium nitride capping layer over the cobalt salicide effectively avoided the oxidation and drastically improved the gate length dependence of the gate sheet resistance, resulting in the achievement of a gate delay of 21 ps for a 0.1 μm gate length and 19 ps for a 0.075 μm gate length.

It has also been proposed to provide a capping layer of titanium over the cobalt layer prior to the silicidation step. Wang et al., in an article entitled "New $CoSi_2$ SALICIDE Technology for 0.1 μm Processes and Below", published on pages 17 and 18 of the 1995 *Symposium on VLSI Technology Digest of Technical Papers*, report that the use of titanium over cobalt in the formation of cobalt silicide provides a much smoother $CoSi_2$/poly interface than the conventional process with less sensitivity to pre-sputtering surface conditions and annealing conditions. They also indicate, however, that it is difficult to form thin $CoSi_2$ on a sub-0.1 μm poly-Si runner using the conventional process, but that the use of a thin titanium capping layer improves both the formation and thermal stability of sub-0.1 μm $CoSi_2$/Poly stacks.

However, it would be desirable to provide a process capable of forming shallow source/drain regions of an MOS device in a semiconductor substrate, as well as to form the doped polysilicon gate electrode, by forming cobalt silicide contacts of uniform thickness, and then implanting the cobalt silicide contacts, followed by subsequent annealing of the structure to cause the implanted dopant to diffuse from the cobalt silicide into either the underlying substrate (to form the desired shallow source/drain regions therein), or into the underlying polysilicon gate electrode (to provide the desired conductivity of the polysilicon gate electrode).

SUMMARY OF THE INVENTION

In accordance with the invention, a process capable of forming shallow source/drain regions in a silicon substrate and a doped gate electrode by implantation of cobalt silicide contacts of uniform thickness previously formed on the substrate followed by diffusion of the dopant into the substrate to form the desired source/drain regions, and into the polysilicon gate electrode to provide the desired conductivity comprises: first depositing a layer of cobalt over a polysilicon gate electrode and areas of a silicon substrate where source/drain regions will be formed; then forming at least one capping layer over the cobalt layer; then annealing the structure at a first temperature to form cobalt silicide; then removing the capping layer, as well as the unreacted cobalt and any cobalt reaction products other than cobalt silicide; then annealing the structure again at a higher temperature than the first anneal to form high temperature cobalt silicide; then implanting the cobalt silicide with one or more dopants suitable for forming source/drain regions in the silicon substrate and for increasing the conductivity of the polysilicon gate electrode; and then heating the structure sufficiently to cause the implanted dopant or dopants in the cobalt silicide to diffuse into the substrate to form the desired source/drain regions and into the polysilicon gate electrode to increase the conductivity thereof.

DETAILED DESCRIPTION OF THE INVENTION

The invention provides a process to form the source/drain regions of an MOS device in a semiconductor substrate, as well as to form the doped polysilicon gate electrode, by providing a protective capping layer over a previously deposited cobalt layer which capping layer is then removed after formation of the desired cobalt silicide of uniform thickness. The previously formed cobalt silicide of uniform thickness is then implanted with at least one dopant, and then subsequently annealed to cause the implanted dopant to diffuse from the cobalt silicide into either the underlying substrate (to form the desired source/drain regions therein), or into the underlying polysilicon gate electrode (to provide the desired conductivity of the polysilicon gate electrode).

Figure 1:
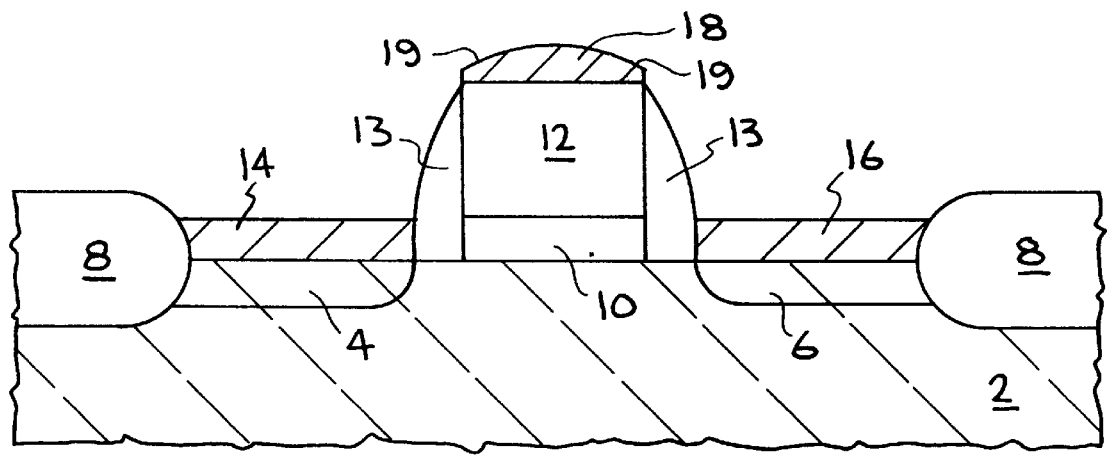
FIG. 1 is a fragmentary vertical cross-sectional view of a portion of a prior art MOS device including a polysilicon gate electrode having a cobalt silicide layer formed over the top surface of the polysilicon gate electrode in accordance with the prior art, illustrating the thinning of the cobalt silicide layer at the edges of the top of the gate electrode.
Figure 2:
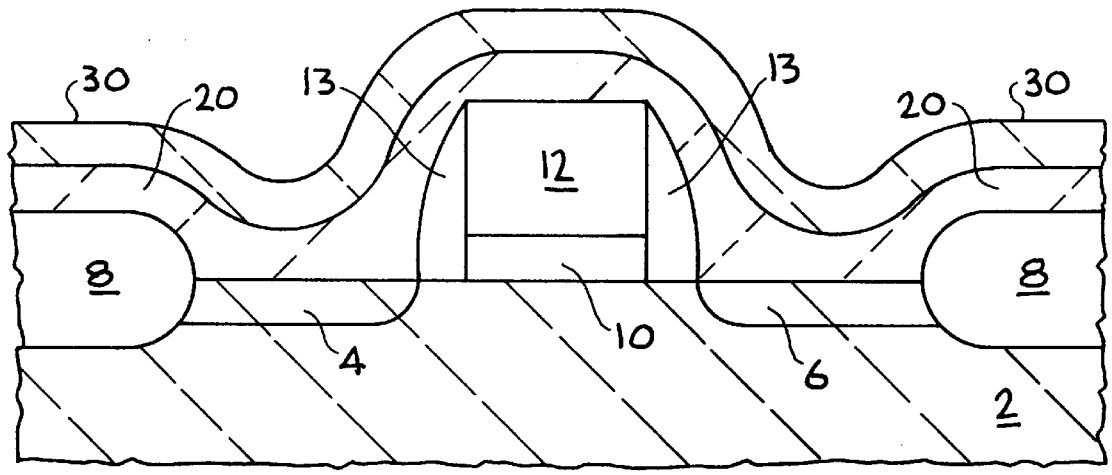
FIG. 2 is a fragmentary vertical cross-sectional view of a portion of an MOS device which includes a polysilicon gate electrode having a cobalt layer formed over the polysilicon gate electrode with a capping layer formed over the cobalt layer prior to the first annealing step to form cobalt silicide, in accordance with the invention.
Figure 3:
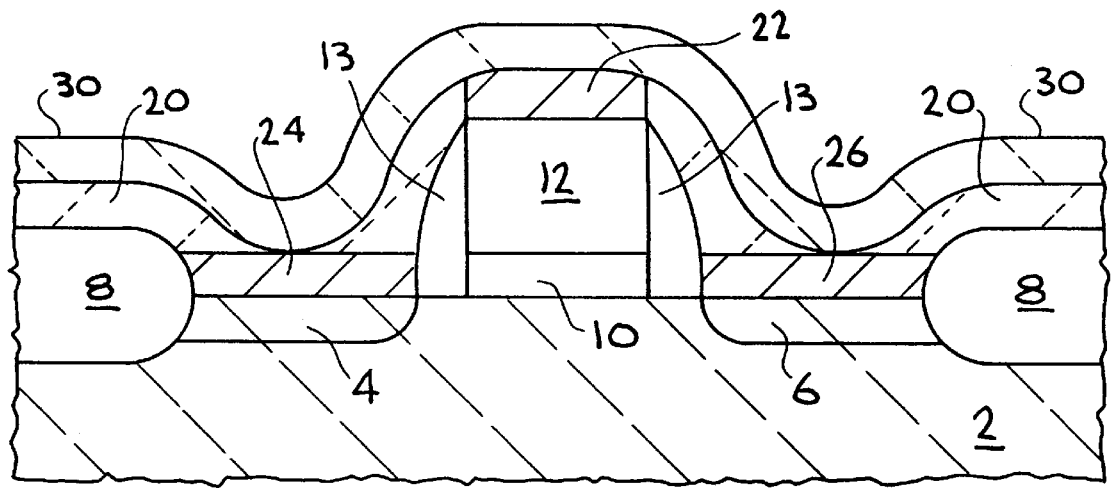
FIG. 3 is a fragmentary vertical cross-sectional view of the structure of FIG. 2 after the structure has been initially annealed to form a cobalt silicide layer of uniform thickness over the top surface of the polysilicon gate electrode, but prior to the removal of the capping layer, the unreacted cobalt, and any cobalt reaction products other than cobalt silicide.
Figure 4:
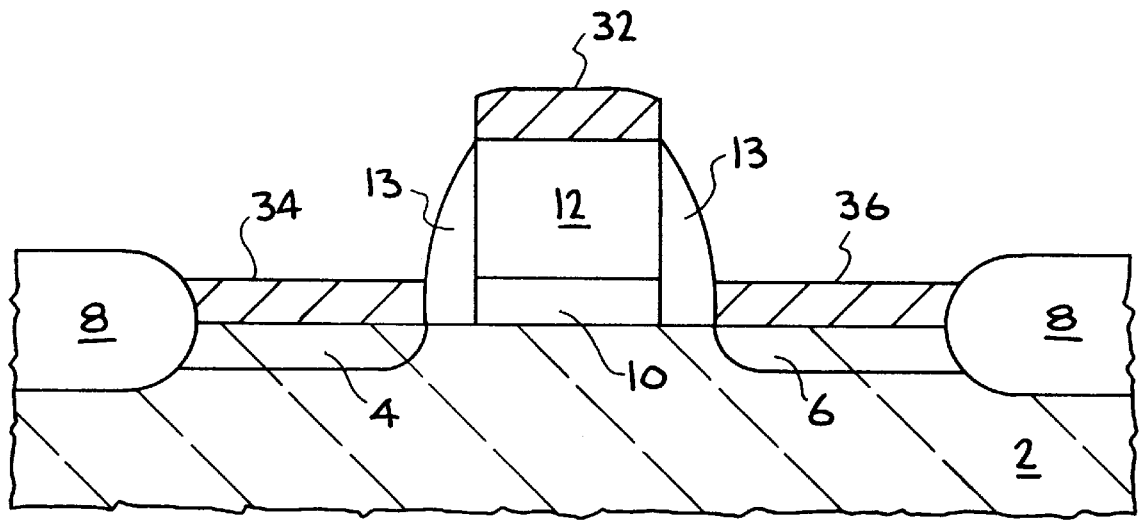
FIG. 4 is a fragmentary vertical cross-sectional view of the structure of FIG. 3 after removal of the capping layer, unreacted cobalt, and cobalt reactions products other than cobalt silicide.

Turning now to FIG. 2, the same basic MOS device is shown as in FIG. 1, but prior to the formation of cobalt silicide over the areas in substrate 2 where source/drain regions 4 and 6 will be formed, or over polysilicon gate electrode 12. (It should be noted that source/drain regions 4 and 6 are shown in FIGS. 2–4 merely for illustrative purposes to show where they will be formed after the implantation and diffusion steps to be described.) FIG. 2 illustrates the preferred embodiment of the invention wherein cobalt layer 20 is first formed over the MOS device (regardless of whether the MOS device is an NMOS device or a PMOS device), and in particular over the exposed upper surfaces of polysilicon gate electrode 12 and over the areas in silicon substrate 2 where source/drain regions 4 and 6 will be formed. A capping layer 30 is then formed over cobalt layer 20 to protect cobalt layer 20 from any contamination prior to the formation of the desired cobalt silicide. Capping layer 30 may comprise a titanium layer, a titanium nitride layer, or even a combination thereof such as described and claimed in copending application Ser. No. 08/833,597, entitled "PROCESS FOR FORMING IMPROVED COBALT SILICIDE LAYER ON INTEGRATED CIRCUIT STRUCTURE USING TWO CAPPING LAYERS", filed by one of us with others on Apr. 7, 1997, assigned to the assignee of this invention, and the subject matter of which is hereby incorporated by reference.

Cobalt layer 20 is deposited over the MOS structure, and in particular over the exposed silicon surfaces of substrate 2 where source/drain regions 4 and 6 will be formed and over the exposed top surface of polysilicon gate electrode 12, to a thickness of at least about 30 Å to provide a sufficient amount of cobalt for the subsequent reaction with the underlying silicon to provide a satisfactory thickness of the desired cobalt silicide. The thickness of the deposited cobalt layer may be up to as much as about 400 Å, with higher amounts being usable, but not deemed necessary. Preferably, the thickness of the cobalt layer will vary from about 125 Å to about 275 Å, with a typical thickness being about 180 Å. Cobalt layer 20 is conventionally deposited over the MOS structure on silicon substrate 2 in a vacuum chamber, such as a sputtering chamber, after appropriate cleaning of the substrate to remove any oxygen-bearing residues. The pressure used in the chamber during the deposition of cobalt layer 20 may vary from about 0.1 milliTorr to about 1 Torr, while the substrate temperature may range from about 20° C. to about 300° C.

Thereafter, and without exposing newly deposited cobalt layer 20 to any oxygen-bearing gases, protective capping layer 30 is formed over cobalt layer 20. Preferably, capping layer 30 is formed over cobalt layer 20 by sputtering in the same sputtering chamber, or at least in another chamber in the same vacuum apparatus, using a different sputtering target. Capping layer 30 may also comprise a metal such as tungsten, molybdenum, tantalum, or niobium (as well as titanium), or a compound of one of such metals such as, for example, the above mentioned titanium nitride.

Capping layer 30, for example, when titanium is used, may be formed to a thickness of at least about 10 Å, preferably at least 50 Å, and up to a thickness of about 1000 Å. Although thicker layers of the capping layer may be used, such is not deemed necessary and thus is deemed to be undesirable from a standpoint of using valuable process time in the deposition apparatus. The chamber pressure used during the deposition of capping layer 30, using titanium as the capping material, may vary from about 0.1 milliTorr to about 1 Torr, while the substrate temperature may range from about 20° C. to about 300° C.

Turning now to FIG. 3, the MOS structure is then initially annealed, after the formation of cobalt layer 20 and capping layer 30 thereon, in accordance with the invention. This first annealing step is preferably carried out using a rapid thermal anneal (RTA) at a temperature ranging from about 350° C. to about 600° C., and most preferably at an annealing temperature of from about 425° C. to about 475° C. for a period of time ranging from about 10 seconds to about 2 minutes, and preferably for a period of from about 10–60 seconds in an annealing chamber in the absence of any oxygen-bearing gases to form low temperature cobalt silicide. The term "low temperature cobalt silicide", as used herein, is intended to define the cobalt silicide (which may be principally CoSi) formed by the initial low temperature anneal at temperatures of 600° C. or less.

As shown in FIG. 3, the portion of cobalt layer 20 directly in contact with polysilicon gate electrode 12, and the portion of silicon substrate 2 where source/drain regions 4 and 6 will be formed, react with the silicon, respectively, to form low temperature cobalt silicide portion 22 over gate electrode 12, and low temperature cobalt silicide portions 24 and 26 above the portions of substrate 2 where source/drain regions 4 and 6 will be formed.

The capping layer 30, the unreacted cobalt in cobalt layer 20, and any other cobalt reaction products (other than cobalt silicide) may be removed (after the annealing step to form low temperature cobalt silicide portions 22, 24, and 26) using, for example, appropriate wet etchants for the respective materials. An example of a wet etchant system which may be used to respectively remove the above-discussed materials is a sulfuric acid-hydrogen peroxide etchant system.

After removal of the capping layer, as well as the unreacted cobalt and any other cobalt reaction products (other than cobalt silicide), the MOS structure is further annealed at a higher temperature of at least about 700° C., and preferably from about 700° C. to about 800° C. to convert the low temperature cobalt silicide to the more desirable high temperature cobalt silicide which has a lower resistivity. This higher temperature anneal, like the prior lower temperature anneal, may be carried out using rapid thermal annealing (RTA) techniques, i.e., for a period of time ranging from about 10 seconds to about 2 minutes, and preferably for a period of from about 10–60 seconds in an annealing chamber. Oxygen-bearing gases are preferably excluded during this second anneal step as well. The term "high temperature cobalt silicide", as used herein, is intended to define the cobalt silicide (which may be principally $CoSi_2$) formed by the subsequent high temperature anneal at temperatures of 700° C. or higher.

The result, as shown in FIG. 4, is an integrated circuit structure with an MOS device having high temperature cobalt silicide segments 32, 34, and 36 of uniform thickness respectively formed over polysilicon gate electrode 12 and over the areas in silicon substrate 2 where source/drain regions 4 and 6 will be formed in substrate 2.

Figure 5:
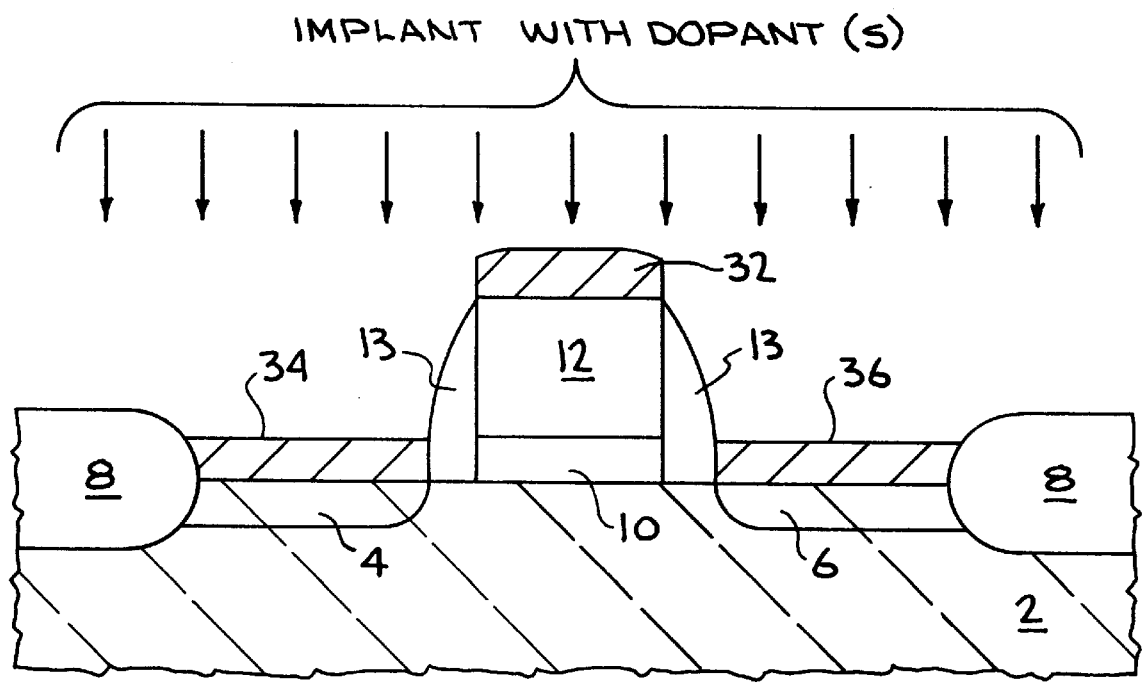
FIG. 5 is a fragmentary vertical cross-sectional view of the structure of FIG. 4 showing the newly formed cobalt silicide being implanted with dopant.
Figure 6:
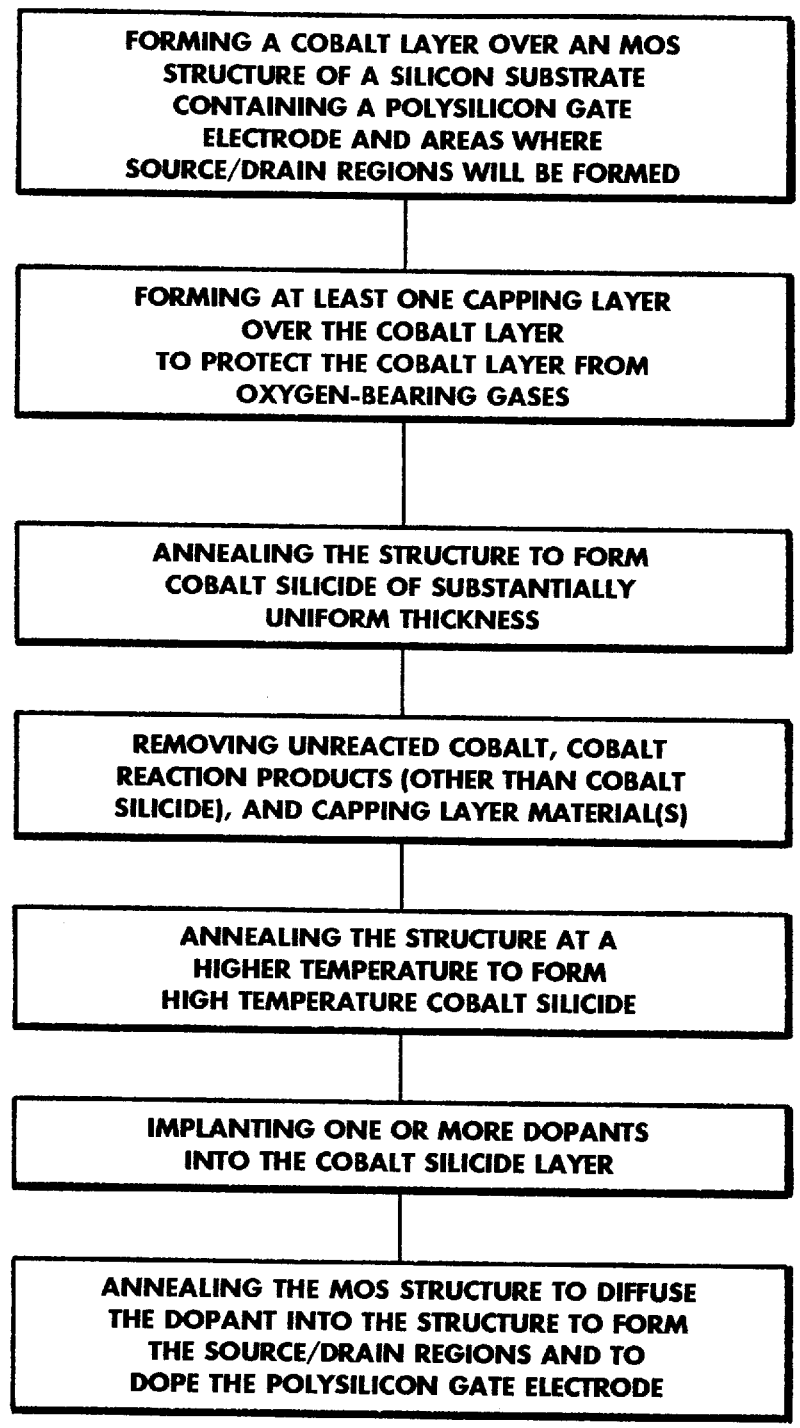
FIG. 6 is a flowsheet illustrating the preferred embodiment of the process of the invention.

The cobalt silicide segments 32, 34, and 36 are then implanted with one or more dopants, as illustrated in FIG. 5, which will be used to form source/drain regions 4 and 6 in substrate 2, and to dope polysilicon gate electrode 12 to increase its conductivity. The type of dopant used will be determined by whether or not an NMOS or PMOS structure is to be formed. When an NMOS structure is to be formed in substrate 2, cobalt silicide segments 32, 34, and 36 may be implanted with phosphorus or arsenic, while boron will be implanted into cobalt silicide segments 32, 34, and 36 when a PMOS structure is being formed. When, for example, cobalt silicide segments 32, 34, and 36 are to be implanted with phosphorus or arsenic, a dosage level, for example, ranging from about $2 \times 10^{15}$ to about $1 \times 10^{16}$ phosphorus or arsenic atoms/$cm^2$ may be used, at an energy level ranging from about 10 to about 50 KEV for phosphorus, or from about 20 KEV to about 100 KEV for arsenic (depending upon the thickness of cobalt silicide segments 34 and 36), to form N doped source/drain regions 4 and 6, and N doped polysilicon gate electrode 12. Boron may be implanted into cobalt silicide segments 32, 34, and 36 at a dosage level, for example, also ranging from about $2 \times 10^{15}$ to about $1 \times 10^{16}$ boron atoms/$cm^2$, and at an energy level ranging from about 10 KEV to about 50 KEV to form P doped source/drain regions 4 and 6, and P doped polysilicon gate electrode 12.

After implantation of cobalt silicide segments 32, 34, and 36, the structure may be annealed at a temperature ranging from about 800° C. to about 1000° C., and most preferably at an annealing temperature of from about 850° C. to about 950° C. for a period of time ranging from about 10 seconds to about 2 minutes, and preferably for a period of from about 10 to about 60 seconds to cause the dopant implanted in the cobalt silicide segments to respectively diffuse into substrate 2 to form source/drain regions 4 and 6, and to diffuse into polysilicon gate electrode 12. The result is the formation of shallow source/drain regions 4 and 6 in substrate 2 having a depth of ranging from about 50 Å to about 1000 Å. It should be noted, in this regard, that the length of time of the anneal will have a greater affect on the depth of source/drain regions 4 and 6 than on the extent of the doping of polysilicon gate electrode 12, due to the much higher diffusion rate of dopants through polysilicon than through single crystal silicon.

Thus, the invention provides a process for the satisfactory formation of cobalt silicide contacts of uniform thickness over silicon surfaces of an integrated circuit structure on a silicon substrate, and for the subsequent formation of shallow source/drain regions in the silicon substrate, by first protecting the deposited cobalt layer, prior to the first annealing step, from exposure to oxygen-bearing gases with a capping layer, and then, after forming the desired cobalt silicide and removal of the capping layer, unreacted cobalt and cobalt reaction products other than cobalt silicide, implanting the cobalt silicide with dopant which is then diffused into the substrate to form the desired shallow source/drain regions.

Having thus described the invention what is claimed is:

1. A process for forming an MOS structure on a silicon substrate, with shallow source/drains regions and cobalt silicide contacts formed over said source/drain regions of said MOS structure and over a polysilicon gate electrode of said MOS structure, which comprises:
    a) forming a cobalt layer over said polysilicon gate electrode and at least regions of said silicon substrate where source/drain regions will be formed;
    b) forming a capping layer over said cobalt layer without exposing said cobalt layer to oxygen-bearing gases;
    c) thereafter annealing said cobalt layer at a first temperature to form cobalt silicide over areas of said silicon substrate where silicon source/drain regions will be formed, and over said polysilicon gate electrode;
    d) removing said capping layer, unreacted cobalt, and cobalt reaction products other than cobalt silicide;
    e) annealing said cobalt silicide at a second temperature higher than said first annealing temperature;
    f) implanting said cobalt silicide with one or more dopants; and
    g) further annealing said cobalt silicide to diffuse said one or more dopants from said cobalt silicide into said silicon substrate to form said source/drain regions in said substrate, and to diffuse said one or more dopants into said polysilicon gate electrode.

2. The process of claim 1 wherein said step of forming said cobalt layer on said MOS structure further comprises depositing from about 30 Å to about 400 Å of cobalt on said MOS structure.

3. The process of claim 1 wherein said step of forming a capping layer over said cobalt layer further comprises depositing from about 10 Å to about 1000 Å of said capping layer over said cobalt layer.

4. The process of claim 3 wherein said capping layer comprises a material selected from the group consisting of titanium, tungsten, molybdenum, tantalum, niobium, and a compound containing one of said metals.

5. The process of claim 3 wherein said capping layer comprises a material selected from the group consisting of titanium, titanium nitride, and tungsten.

6. The process of claim 1 wherein said step of annealing said structure at said first annealing temperature further comprises annealing said MOS structure at a temperature not exceeding about 600° C.

7. The process of claim 1 wherein said step of annealing said structure at said first annealing temperature further comprises annealing said MOS structure at a temperature ranging from about 350° C. to about 600° C.

8. The process of claim 7 wherein said step of annealing said structure at said first annealing temperature further comprises annealing said MOS structure at a temperature ranging from about 425° C. to about 475° C.

9. The process of claim 1 wherein said step of annealing said structure at said second annealing temperature further comprises annealing said MOS structure at a temperature of at least about 700° C.

10. The process of claim 1 wherein said step of annealing said structure at said second annealing temperature further comprises annealing said MOS structure at a temperature ranging from about 700° C. to about 800° C.

11. The process of claim 1 wherein said step of implanting said one or more dopants into said cobalt silicide further comprises implanting said dopants into said cobalt silicide at an energy level ranging from about 10 KEV to about 100 KEV.

12. The process of claim 1 wherein said step of implanting said one or more dopants into said cobalt silicide further comprises implanting either boron or phosphorus into said cobalt silicide at an energy level ranging from about 10 KEV to about 50 KEV.

13. The process of claim 1 wherein said step of implanting said one or more dopants into said cobalt silicide further comprises implanting arsenic into said cobalt silicide at an energy level ranging from about 20 KEV to about 100 KEV.

14. The process of claim 1 wherein said step of further annealing said MOS structure to diffuse said one or more dopants from said cobalt silicide into said silicon substrate further comprises annealing said MOS structure at a temperature ranging from about 800° C. to about 1000° C.

15. The process of claim 14 wherein said step of further annealing said MOS structure to diffuse said one or more dopants from said cobalt silicide into said silicon substrate further comprises annealing said MOS structure for a period of from about 10 seconds to about 2 minutes.

16. The process of claim 14 wherein said step of further annealing said MOS structure to diffuse said one or more dopants from said cobalt silicide into said silicon substrate further comprises annealing said MOS structure for a period of from about 20 seconds to about 60 seconds.

17. A process for forming an MOS structure on a silicon substrate, with shallow source/drains regions and cobalt silicide contacts formed over said source/drain regions of said MOS structure and over a polysilicon gate electrode of said MOS structure, which comprises:
    a) forming over said polysilicon gate electrode and at least regions of said silicon substrate where source/drain regions will be formed a cobalt layer having a thickness ranging from about 30 Å to about 400 Å;
    b) forming over said cobalt layer a capping layer having a thickness ranging from about 10 Å to about 1000 Å, without exposing said cobalt layer to oxygen-bearing gases;
    c) thereafter annealing said cobalt layer at a first temperature not exceeding about 600° C. to form cobalt silicide over areas of said silicon substrate where silicon source/drain regions will be formed, and over said polysilicon gate electrode;
    d) removing said capping layer, unreacted cobalt, and cobalt reaction products other than cobalt silicide;
    e) annealing said cobalt silicide at a second temperature of at least about 700° C.;
    f) implanting said cobalt silicide with one or more dopants at an energy level ranging from about 10 KEV to about 100 KEV; and g) further annealing said cobalt silicide at a temperature of from about 800° C. to about 1000° C. to diffuse said one or more dopants from said cobalt silicide into said silicon substrate to form said source/drain regions in said substrate, and to diffuse said one or more dopants into said polysilicon gate electrode.

18. The process of claim 17 wherein said capping layer comprises a material selected from the group consisting of titanium, tungsten, and titanium nitride.

19. The process of claim 17 wherein said step of annealing said structure at said first annealing temperature further comprises annealing said MOS structure at a temperature ranging from about 350° C. to about 600° C.

20. The process of claim 17 wherein said step of annealing said structure at said second annealing temperature further comprises annealing said MOS structure at a temperature ranging from about 700° C. to about 800° C.

21. The process of claim 17 wherein said step of further annealing said MOS structure to diffuse said one or more dopants from said cobalt silicide into said silicon substrate further comprises annealing said MOS structure for a period of from about 10 seconds to about 2 minutes.

22. A process for forming an MOS structure on a silicon substrate, with shallow source/drains regions and cobalt silicide contacts formed over said source/drain regions of said MOS structure and over a polysilicon gate electrode of said MOS structure, which comprises:

a) forming over said polysilicon gate electrode and at least regions of said silicon substrate where source/drain regions will be formed a cobalt layer having a thickness ranging from about 30 Å to about 400 Å;

b) forming over said cobalt layer a capping layer comprising a material selected from the group consisting of titanium, tungsten, and titanium nitride, having a thickness ranging from about 10 Å to about 1000 Å, without exposing said cobalt layer to oxygen-bearing gases;

c) thereafter annealing said cobalt layer at a first temperature of from about 350° C. to about 600° C. to form cobalt silicide over areas of said silicon substrate where silicon source/drain regions will be formed, and over said polysilicon gate electrode;

d) removing said capping layer, unreacted cobalt, and cobalt reaction products other than cobalt silicide;

e) annealing said cobalt silicide at a second temperature of from about 700° C. to about 800° C.;

f) implanting said cobalt silicide with one or more dopants selected from the group consisting of boron, phosphorus, and arsenic at an energy level ranging from about 10 KEV to about 50 KEV for boron and phosphorus, and ranging from about 20 KEV to about 100 KEV for arsenic; and g) further annealing said cobalt silicide for a period of from about 10 seconds to about 2 minutes at a temperature of from about 800° C. to about 1000° C. to diffuse said one or more dopants from said cobalt silicide into said silicon substrate to form said source/drain regions in said substrate, and to diffuse said one or more dopants into said polysilicon gate electrode.

* * * * *